United States Patent
Buynoski (10) Patent No.: US 6,518,113 B1
(45) Date of Patent: Feb. 11, 2003

(54) DOPING OF THIN AMORPHOUS SILICON WORK FUNCTION CONTROL LAYERS OF MOS GATE ELECTRODES

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,853

(22) Filed: Feb. 6, 2001

(51) Int. Cl.[7] .......................................... H01L 21/8238
(52) U.S. Cl. ..................... 438/217; 438/291; 438/482; 438/486; 438/517; 438/530; 438/558; 438/595; 438/923
(58) Field of Search ................................ 438/217, 291, 438/482, 486, 517, 530, 545, 558, 595, 923, FOR 193, FOR 320, 592

(56) References Cited

U.S. PATENT DOCUMENTS

| | | | |
|---|---|---|---|
| 4,745,082 A | | 5/1988 | Kwok |
| 5,447,874 A | | 9/1995 | Grivna et al. |
| 5,728,610 A | * | 3/1998 | Gosain et al. ............... 438/158 |
| 5,750,430 A | * | 5/1998 | Son ............................ 438/291 |
| 5,849,612 A | * | 12/1998 | Takahashi et al. ........... 438/151 |
| 5,869,374 A | * | 2/1999 | Wu ............................. 438/291 |
| 5,882,964 A | * | 3/1999 | Schwalke ..................... 297/297 |
| 5,960,270 A | | 9/1999 | Misra et al. |
| 6,033,963 A | | 3/2000 | Huang et al. |
| 6,037,204 A | * | 3/2000 | Chang et al. ................. 438/231 |
| 6,117,717 A | * | 9/2000 | Carbone et al. .............. 257/370 |
| 6,248,675 B1 | * | 6/2001 | Xiang et al. ................. 438/166 |
| 6,433,553 B1 | * | 8/2002 | Goeckner et al. ............ 324/464 |

OTHER PUBLICATIONS

Ueda M., et al. "Application of a dc glow discharge source with controlled plasma potential in plasma immersion ion implantation", Nov. 1, 1999, Journal of Applied Physics, pp. 4821–4824.*

Berni L.A., et al. "Experimental results of a dc glow discharge source with controlled plasma floating potential for plasma immersion ion implantation", Aug. 10, 1999, Journal of Physics, pp. 1592–1595.*

Liebert R.B., et al. "Plasma Doping System for 200 and 300mm Wafers", 2000 International Conference on Ion Implantation Technology Proceedings, pp. 472–475.*

* cited by examiner

Primary Examiner—George Fourson
Assistant Examiner—Michelle Estrada (57) ABSTRACT

Work function control layers are provided in in-laid, metal gate electrode, Si-based MOS transistors and CMOS devices by a process which avoids deleterious dopant implantation processing resulting in damage to the thin gate insulator layer and undesirable doping of the underlying channel region. According to the invention, an amorphous Si layer is formed over the thin gate insulator layer by a low energy deposition process which does not adversely affect the gate insulator layer and subsequently doped by means of another low energy process, e.g., low sheath voltage plasma doping, which does not damage the gate insulator layer or dope the underlying channel region of the Si-based substrate. Subsequent thermal processing during device manufacture results in activation of the dopant species and conversion of the a-Si layer to a doped polycrystalline Si layer of substantially increased electrical conductivity.

17 Claims, 7 Drawing Sheets

DOPING OF THIN AMORPHOUS SILICON WORK FUNCTION CONTROL LAYERS OF MOS GATE ELECTRODES

FIELD OF THE INVENTION

The present invention relates to methods of manufacturing semiconductor devices including a gate electrode, e.g., MOS transistors and CMOS devices. More specifically, the present invention relates to methods of manufacturing MOS and CMOS semiconductor devices wherein the source, drain, channel regions, and the gate electrodes of MOS transistors are formed in a self-aligned manner utilizing an in-laid ("damascene") gate and corresponding processing techniques therefor. The present invention has particular utility in the manufacture of high integration density semiconductor devices employing design rules of 0.20 μm and below, e.g., 0.15 μm and below.

BACKGROUND OF THE INVENTION AND RELATED ART

The escalating requirements for high density and performance (e.g., transistor and circuit speeds) associated with ultra-large scale integration ("ULSI") devices necessitate design rules for component features of 0.20 μm and below, such as 0.15 μm and below, such as source, drain, and gate regions and electrodes therefor formed in or on a common semiconductor substrate, challenges the limitations of conventional materials and manufacturing processes and necessitates use of alternative materials and development of new methodologies therefor.

An example of the above-mentioned challenge based upon the limitations inherent in conventional materials and methodologies utilized in the semiconductor integrated circuit ("IC") industry is the use of polysilicon for forming gate electrodes of metal-oxide-semiconductor ("MOS") transistors. Polysilicon is conventionally employed as a gate electrode material in MOS transistors in view of its good thermal stability, i.e., ability to withstand high temperature processing. More specifically, the good thermal stability of polysilicon-based materials permits high temperature annealing thereof during formation/activation of implanted source and drain regions. In addition, polysilicon-based materials advantageously block implantation of dopant ions into the underlying channel region of the transistor, thereby facilitating formation of self-aligned source and drain regions after gate electrode deposition/patterning is completed.

However, polysilicon-based gate electrodes incur a number of disadvantages, including, inter alia: (1) as device design rules decrease to below about 0.20 μm, polysilicon gates are adversely affected by poly depletion, wherein the effective gate oxide thickness ("EOT") is increased. Such increase in EOT can reduce performance by about 15% or more; (2) polysilicon-based gate electrodes have higher resistivities than most metal or metallic materials and thus devices including polysilicon as electrode or circuit materials operate at a much slower speed than equivalent devices utilizing metal based materials. Further, a significant portion of the voltage applied to the gate during operation is dropped in the polysilicon due to the poor conductivity of silicon. As a consequence, in order to compensate for the higher resistance, polysilicon-based materials require silicide processing in order to decrease their resistance and thus increase the operational speeds of polysilicon-based devices to acceptable levels; (3) use of polysilicon-based gates necessitates ion implantation of different dopant atoms for p-channel transistors and n-channel transistors formed in a CMOS device, which different dopant species are required for the p-channel and n-channel transistors to have compatible threshold voltages ("$V_t$"). Disadvantageously, the threshold adjust implant is of sufficiently high doping concentration as to adversely impact the mobility of charge carriers in and through the channel region; and (4) polysilicon-based gate electrodes are less compatible with high dielectric constant ("high-k") materials (i.e., >5, preferably >20) which are desirable for use as gate oxide layers, than are metal-based gate electrodes.

In view of the above-described drawbacks and disadvantages associated with the use of polysilicon-based materials as gate electrodes in MOS and CMOS transistor devices, several process schemes for making self-aligned MOS and/or CMOS transistor devices utilizing in-laid ("damascene") metal or metal-based gate electrodes have been proposed, such as are described in U.S. Pat. No. 4,745,082 (Kwok et al.); U.S. Pat. No. 5,447,874 (Grivna et al.); U.S. Pat. No. 5,960,270 (Misra et al.); and U.S. Pat. No. 6,033,963 (Huang et al.).

Metal or metal-based gate electrode materials offer a number of advantages vis-à-vis conventional polysilicon-based materials, including: (1) since many metal materials are mid-gap work function materials, the same metal gate material can function as a gate electrode for both n-channel and p-channel transistors in a CMOS process without disadvantageously requiring threshold voltage ($V_t$) adjust implants while maintaining $V_t$ at compatible levels; (2) metal gates allow the charge carrier mobility of the channel region to be improved since the channel region will no longer need high dose threshold implants and higher doping profiles in the MOS channel region; (3) metal gate electrodes have a greater conductivity than polysilicon electrodes and do not require complicated silicide processing in order to perform at high operational speeds; (4) unlike polysilicon-based gate electrodes, metal gate electrodes do not suffer from polysilicon depletion which alters the EOT of an MOS transistor, thereby affecting the performance of the MOS device (i.e., thinner EOTs, while possibly resulting in an increased leakage current, result in faster operating devices); (5) metal gate MOS devices are advantageous for use in fully-depleted silicon-on-insulator ("SOI") devices since $V_t$ of these devices can be more accurately controlled; and (6) metal gate electrodes are more compatible with high-k dielectrics than conventional polysilicon processing.

The use of metal or metallic materials as replacements for polysilicon-based materials as gate electrodes in MOS and/or CMOS devices incurs several difficulties, however, which difficulties must be considered and overcome in any metal-based gate electrode process scheme, including: (1) metal and/or metal-based gates cannot withstand the higher temperatures and oxidative ambients which conventional polysilicon-based gate electrode materials can withstand; (2) several candidate metals or metallic materials for use as gate electrodes do not exhibit adequate adhesion in film form to surrounding layers of different materials when these metals or metallic materials are patterned to very small geometries; (3) some metal or metallic films are difficult to lithographically pattern and etch via conventional processing techniques because etching thereof may significantly damage underlying oxides, thereby adversely affecting device performance; and (4) thermal processing subsequent to metal gate electrode formation may result in instability and degradation of the gate oxide due to chemical interaction between the metal and oxide at the metal gate-gate oxide interface.

An example of a suitable process sequence for forming an in-laid (or damascene) gate electrode is disclosed in U.S. Pat. No. 5,960,270, which process overcomes the above-enumerated difficulties associated with the use of metal or metal-based materials as gate electrodes in MOS and/or CMOS transistor devices, and is described below with reference to FIGS. 1–7. Briefly stated, according to this process, an in-laid, metal-gated MOS transistor is fabricated which comprises self-aligned source and drain electrodes which are formed before the in-laid metal gate electrode is formed. An opening is formed in a dielectric layer overlying a semiconductor substrate to define locations for source and drain regions, which source and drain regions are formed by thermally out-diffusing dopant atoms from overlying metal silicide regions, which metal silicide regions have been formed into source and drain segments in a self-aligned manner by formation of the opening in the dielectric layer. As a consequence, the source and drain regions are formed self-aligned to the opening in the dielectric layer, and the latter are then subsequently filled with the metal or metal-based gate electrode material (after gate oxide formation by thermal oxidation of the substrate surface exposed through the opening). Since, according to this process scheme, doping of the source and drain regions is thermally driven and the source and drain regions are thermally activated before formation of the in-laid metal-based gate electrode, subjection of the latter to adverse thermal processing can be avoided.

Figure 1:
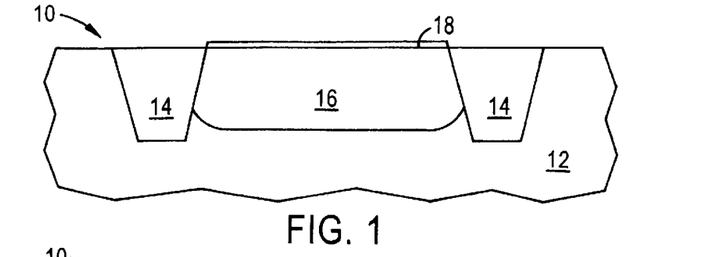
FIGS. 1–7 are schematic, simplified, cross-sectional views illustrating stages in the formation of an in-laid gate electrode MOS transistor according to a first method.

Referring specifically to FIG. 1, a first process for fabricating an MOS transistor device 10 comprises providing a semiconductor substrate 12, typically a silicon (Si) wafer, in which trench-like dielectric field isolation regions 14 are formed, as by conventional techniques, e.g., local oxidation of silicon ("LOCOS"), followed by formation of a p-type or n-type well region 16 in the substrate region intermediate adjacent field oxide regions 14. It should be recognized that, while in the figure, only one (1) well region is illustrated, a plurality of well regions of different conductivity type may be formed in the substrate for fabrication of, e.g., a CMOS device. In any event, after formation of the well region 16, an about 300–400 Å thick suicide layer 18, preferably of either cobalt silicide ($CoSi_2$) or nickel silicide (NiSi) is selectively formed overlying the well region 16, as by a selective growth process. The suicide layer 18 is doped with an appropriate conductivity type dopant, depending upon whether an NMOS or PMOS transistor is to be formed, either by ion implantation subsequent to its deposition or by in situ doping during deposition.

Figure 2:
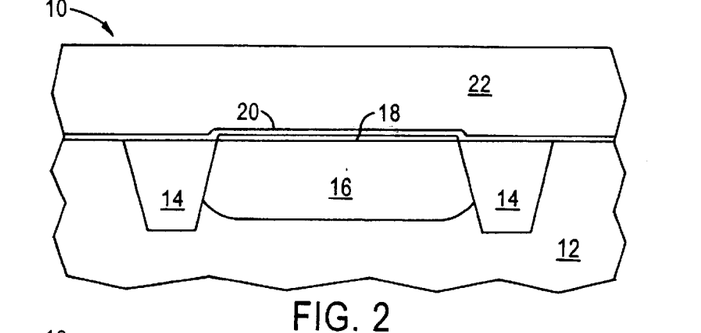

Referring now to FIG. 2, a thin (i.e., about 500 Å thick) plasma-enhanced chemical vapor deposited ("PECVD") nitride layer 20 (utilized as an etch stop layer in subsequent processing) is then deposited so as to overlie the trench isolation regions 14 and the silicide layer 18. An about 1,000–4,000 Å thick (~2,000 Å being preferred), low temperature dielectric oxide layer 22, e.g., of tetraethylorthosilicate ("TEOS") is then blanket-deposited over nitride layer 20.

Figure 3:
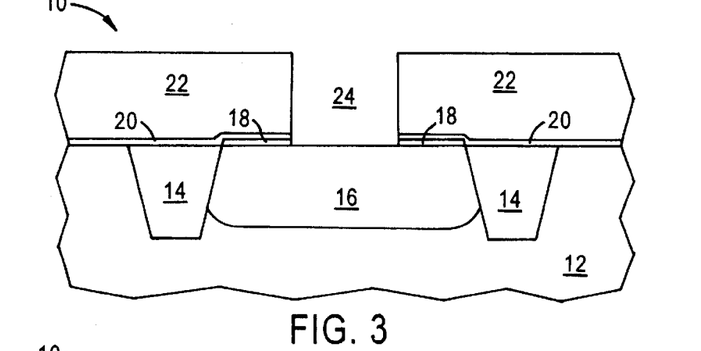

Adverting to FIG. 3, an opening 24 is then formed in the oxide layer 22 overlying a central portion of well region 16, as by conventional photolithographic masking and etching techniques including plasma etching, the opening 24 extending through the nitride 20 and silicide 18 layers to expose at the bottom thereof a portion of the surface of semiconductor substrate 12. The opening 24 segments the silicide layer 18 into two separated portions, each of which is utilized for forming a respective underlying source or drain region of an MOS transistor in a following processing step.

Figure 4:
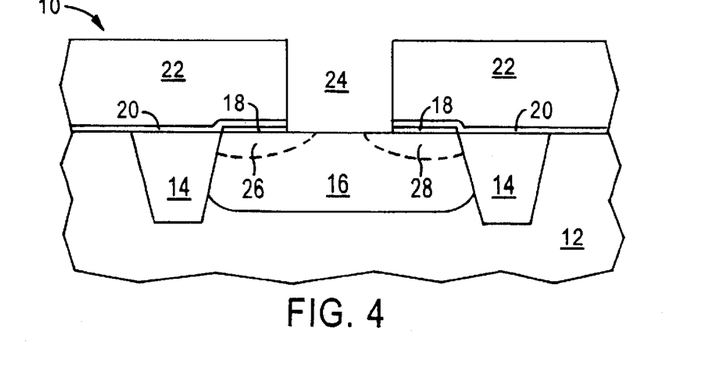

Referring to FIG. 4, a thermal out-diffusion process is then performed for driving the dopant species out of the two silicide regions 18 to form respective underlying, fully self-aligned source and drain regions 26 and 28 within the substrate 12, the dopant species diffusing both vertically and laterally within the semiconductor substrate material. The doped silicide regions 18 remain in place for use as a portion of the source and drain electrodes, whereby the conductivity of these electrodes is enhanced.

Figure 5:
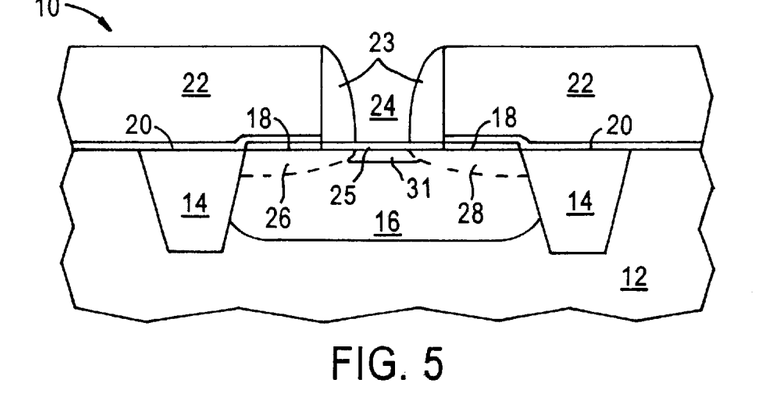

As next illustrated in FIG. 5, an about 100 Å thick layer 25 of a sacrificial oxide, e.g., a silicon oxide, is formed, as by thermal oxidation, on the surface of the semiconductor substrate 12 exposed at the bottom of opening 24, and sidewall spacers 23, typically of a silicon nitride ($Si_xN_y$), are formed on the internal wall surface of the opening 24, e.g., by conventional techniques. A threshold voltage ($V_t$) adjust implant is then performed at a low ion implant energy to form $V_t$ adjust doped (i.e., implanted) region 31 within the portion of the well region 16 exposed through opening 24, after which the exposed portion of the sacrificial oxide layer 25 (i.e., the portion not covered by the sidewall spacers 23) is removed, as by etching. The spacers 23 provide a necessary offset for not only compensating for lateral diffusion of the source and drain regions 26 and 28 but also for electrical isolation of subsequent gate electrode formations from the silicide regions 18, whereby Miller effects are reduced.

Figure 6:
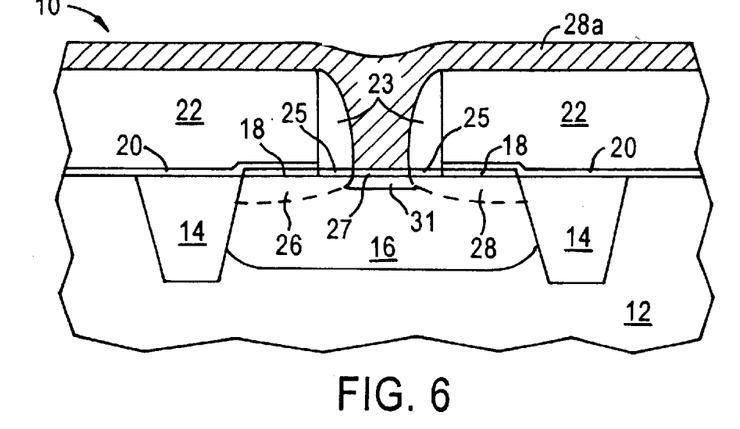

With reference to FIG. 6, a thermal oxidation of the exposed portion of the well region 18 is performed to form a thermal gate oxide layer 27 (or a high-k dielectric layer), and a metal or metal-containing electrically conductive material (e.g., comprising one or more of molybdenum (Mo), tungsten (W), titanium (Ti), aluminum (Al), tungsten silicide ($WSi_2$), nickel silicide ($NiSi_2$), titanium nitride (TiN), and composites thereof) is deposited, via a suitable deposition process, e.g., chemical vapor deposition ("CVD"), to form a sufficiently thick blanket layer 28a filling the opening 24 and extending over the upper surface of dielectric layer 22.

Figure 7:
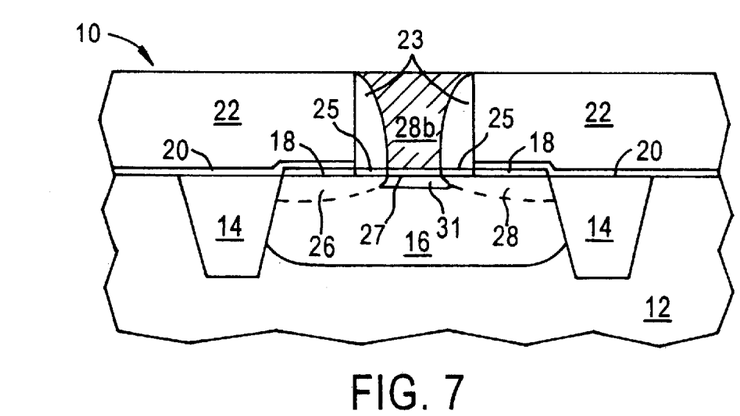

Referring now to FIG. 7, the in-laid gate electrode process is completed by performing a planarization step, typically chemical-mechanical-polishing ("CMP"), for removing the portions of blanket layer 28a extending over the dielectric layer and for rendering the upper surface of the remaining electrically conductive plug 28b (constituting the gate electrode) co-planar with the upper, exposed surface of dielectric layer 22. Electrical contacts to the source and drain regions 26 and 28 may then be formed, as by conventional photolithographic masking and etching techniques, to form openings in dielectric layer 22 extending to the respective silicide layers 18, which openings are then filled with an electrically conductive material, e.g., a metal.

Another example of a suitable process sequence disclosed in U.S. Pat. No. 5,960,270 for forming an in-laid gate electrode for use in MOS and/or CMOS devices is described below with reference to FIGS. 8–16. Briefly stated, according to this process, a polysilicon or amorphous silicon ("a-Si") "dummy" or temporary gate electrode is formed and utilized as a mask for implanting self-aligned source and drain regions in the substrate. After formation of the source/drain regions, a dielectric layer is blanket-deposited and planarized (as by CMP) to expose a top portion of the dummy/temporary polysilicon or a-Si gate electrode. The polysilicon or a-Si dummy/temporary gate electrode is then removed to form a void where it was once located, which void is then filled with a metal or metal-containing gate electrode material, the latter being aligned to the source/drain regions by virtue of being formed in a location previously occupied by the self-aligned polysilicon or a-Si dummy/temporary gate.

Figure 8:
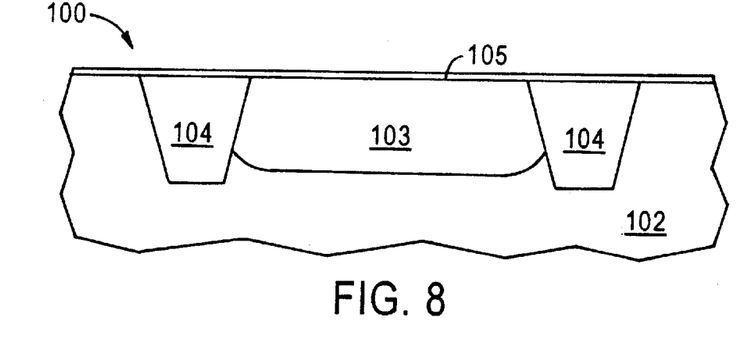
FIGS. 8–16 are schematic, simplified, cross-sectional views illustrating stages in the formation of an in-laid gate electrode MOS transistor according to a second method.

Referring to FIG. 8, an initial step in the manufacture of semiconductor device 100 comprises formation of trench isolation regions 104 of a dielectric material in a suitable semiconductor substrate 102 (as in FIG. 1 of the first process), along with doped well regions 103 (i.e., at least one n-type well region and at least one p-type well region) for enabling CMOS device formation. A sacrificial thermal gate oxide layer 105 is formed over the upper surface of substrate 102 and then removed in order to yield a clean, active upper surface within the well region(s) 103.

Figure 9:
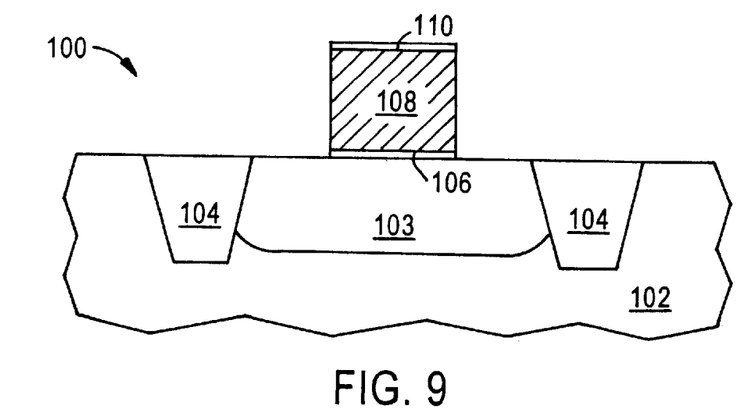

Adverting to FIG. 9, a gate oxide layer 106 is formed on the exposed surface of well region 103, followed by sequential deposition thereon of a polysilicon dummy/temporary gate electrode 108 and an antireflective coating ("ARC") layer 110. The thus-obtained multi-layer structure is then subjected to photolithographic patterning/etching to form a dummy gate electrode stack.

Figure 10:
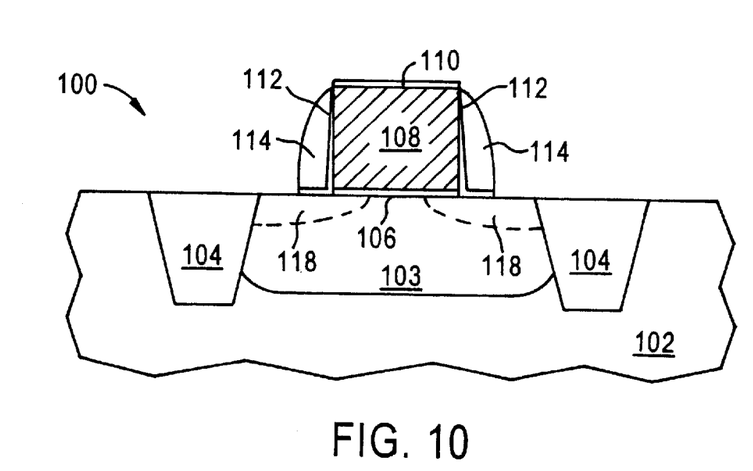

With reference to FIG. 10, a sidewall gate oxidation is then performed to form sidewall oxidation layer 112, followed by formation thereon of tapered sidewall spacers 114, typically of a silicon nitride. Source and drain regions 118 are then formed in a self-aligned manner, as by conventional ion implantation and lightly-doped drain ("LDD") processing.

Figure 11:
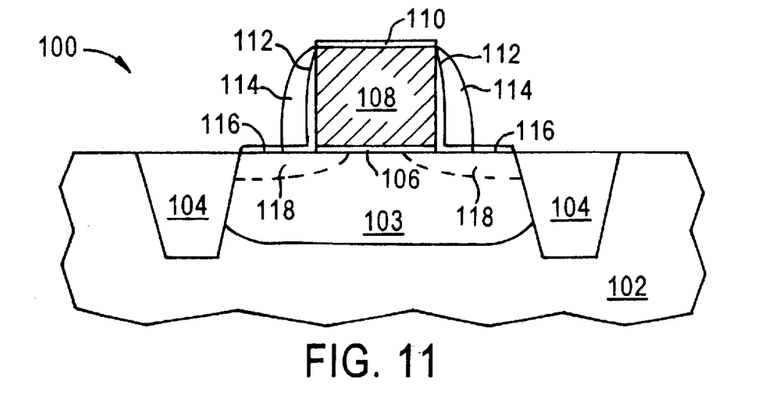

Referring to FIG. 11, a refractory metal layer (e.g., of Co or Ti) is then deposited over the exposed upper surface of the thus-obtained structure and thermally reacted with the exposed silicon (Si) portions of the source and drain regions 118 to form an upper metal silicide layer 116 in contact with a portion of each of the source and drain regions. Silicide layer 116 does not form on the top of the polysilicon dummy gate electrode layer 108 due to the presence of the ARC layer 110.

Figure 12:
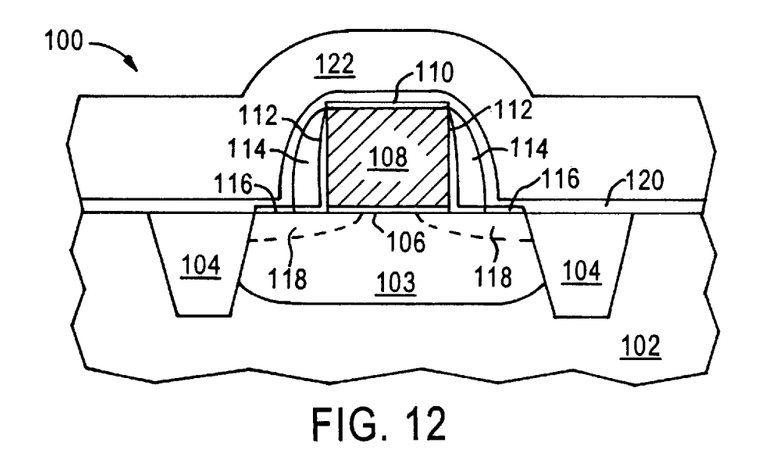
Figure 13:
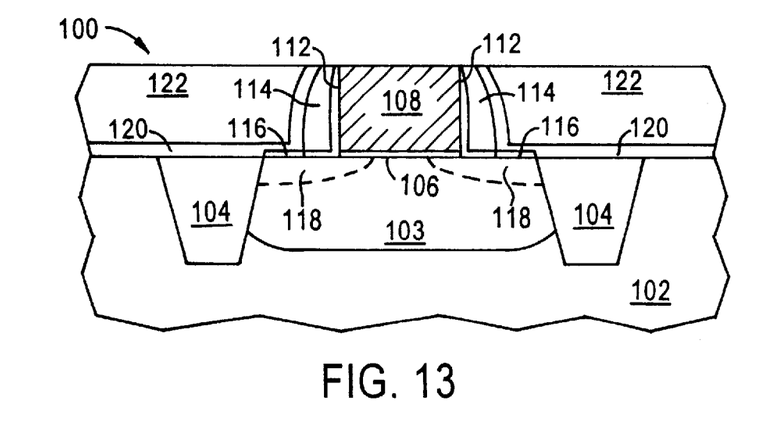

In a following step, illustrated in FIG. 12, a nitride layer 120 is formed over the upper, exposed surface by a plasma enhanced deposition process, and a blanket-deposited dielectric layer 122 (e.g., a TEOS layer) deposited thereover to form an inter-level dielectric layer ("ILD") 120/122. Then, as shown in FIG. 13, a suitable planarization process, e.g., CMP, is performed on the ILD layer utilizing polysilcon layer 108 as a polishing stop, thereby exposing the top surface of polysilicon dummy/temporary gate electrode layer 108.

Figure 14:
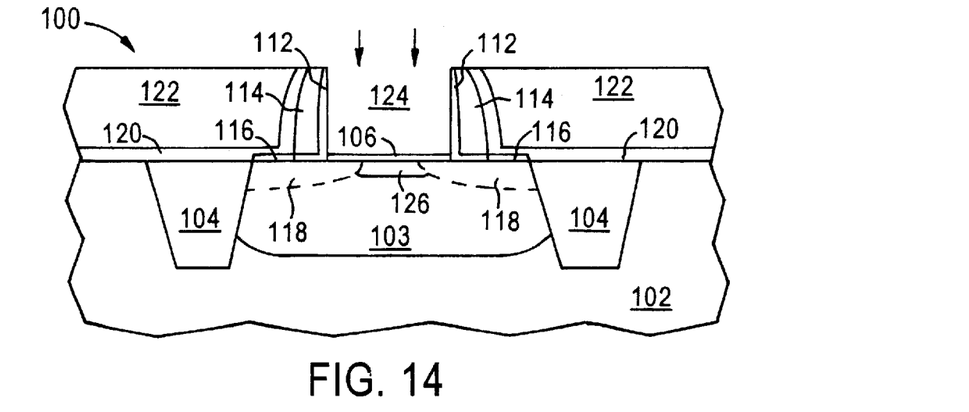

Referring now to FIG. 14, the polysilicon dummy/temporary gate electrode layer 108 is removed by means of a selective etching process (e.g., reactive ion etching ("RIE") in a chlorine ($Cl_2$) plasma or wet polysilicon etching) to form a feature opening 124. $V_t$ is then optionally adjusted, as needed, by means of ion implantation through the feature opening 124 and the gate oxide layer 106 to form $V_t$ doped region 126. Gate oxide layer 106 is typically a sacrificial oxide layer which is removed and replaced with a high-k gate dielectric layer 125, as by thermal processing.

Figure 15:
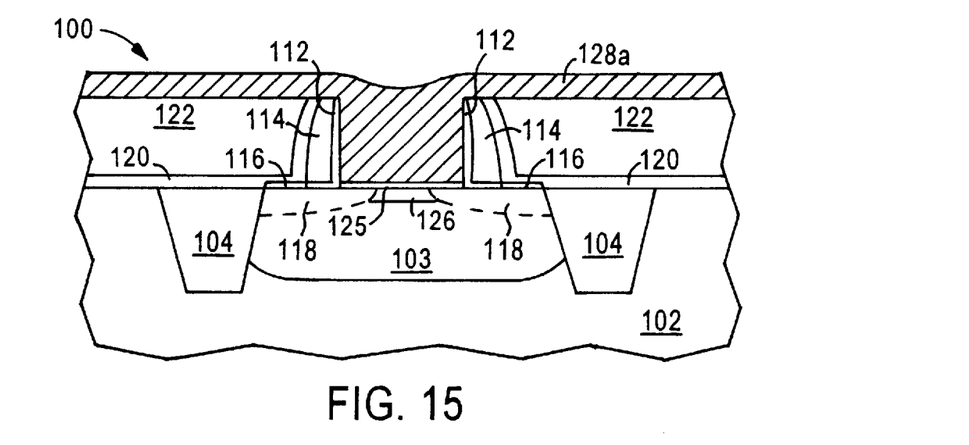

Adverting to FIG. 15, a metal or metal-based layer, e.g., of W, Mo, Ti, Al, TiN, $WSi_2$, $TiSi_2$, etc., is deposited as to fill the feature opening 124 and form a blanket or overburden layer 128a extending over the upper surfaces of the structure. In a following step, shown in FIG. 16, blanket or overburden layer 128a is planarized, as by CMP, to form a metal plug 128b filling the feature opening 124. Thus, metal gate electrode 128b is of substantially similar dimension and location as the dummy/temporary polysilicon gate electrode 108. As a consequence, the metal gate electrode 128b is self-aligned to the source/drain regions 118 formed within the substrate 102, as was dummy/temporary gate electrode 108.

In either of the above-described variants of in-laid metal gate electrode processing sequences, the ultimately formed gate oxide layer (27 or 125) is preferably comprised of a high-k dielectric material, inasmuch as such high-k dielectric materials advantageously provide greater coupling between the gate electrode and the underlying channel region of MOS transistors.

In order for the in-laid, metal-based gate electrodes of the MOS transistors and/or CMOS devices fabricated by the above-described in-laid (damascenc) processing techniques to exhibit proper (i.e., desired) work functions, hence threshold voltages, $V_t$, for both PMOS and NMOS transistors, it is generally necessary to perform additional processing to control/adjust the work functions thereof. As has been indicated above, conventional processing techniques utilized for adjustment/control of $V_t$ of polysilicon-based gate electrodes, e.g., $V_t$ adjust implantation of the gate electrode material, are both inappropriate and undesirable for use with metal-based gate electrodes. As a consequence, suitable $V_t$ adjustment/control techniques which have been developed for use with metal-based gate electrode structures include, for example, placement of a thin doped Si layer, typically a polycrystalline Si layer, between the lower surface of the metal-based gate electrode and the thin gate insulator layer or use of dual metal layers for the gate electrode. However, the latter (i.e., dual metal layer) approach is complicated by the aforementioned difficulties associated with forming ultra-small dimensioned metal layers, poor adhesion, contamination of adjacent materials due to metal atom/ion diffusion, etc., and the former (i.e., Si doping) approach incurs a significant drawback in that the energies of the dopant species (i.e., atoms, ions, molecules) incorporated into the Si layer, typically by implantation processing, must be sufficiently low so as to (1) prevent damage to the underlying thin gate dielectric insulator layer and (2) to not dope the channel region lying beneath the gate insulator layer. As a consequence of the foregoing considerations, the use of conventional doping techniques based upon ion implantation for doping thin, polycrystalline Si layers overlying thin gate insulator layers for adjustment/control of $V_t$ is severely limited.

Accordingly, there exists a need for improved methodology for performing simple, reliable, rapid, and cost-effective control and adjustment of the work function, thus $V_t$, of MOS transistors and CMOS devices utilizing in-laid, metal gate electrodes, which methodology avoids the drawbacks and disadvantages associated with the conventional techniques described supra and provides, inter alia, in-laid, metal-gated MOS transistors and CMOS devices having precisely controlled and regulated work functions, hence optimized threshold voltages, $V_t$.

The present invention, wherein a thin amorphous Si layer is initially formed over the thin gate insulator layer, rather than the polycrystalline Si layer typical of the conventional art, and is subsequently doped by means of a process utilizing low energy dopant species and subsequently converted into the desired doped polycrystalline Si layer, thereby preventing, or at least substantially reducing, damage to the gate insulator layer and doping of the underlying channel region, effectively addresses and solves the need for improved methodology for the manufacture of high quality, in-laid metal-gate MOS transistors and CMOS devices having precisely controlled and regulated threshold voltages, $V_t$, in a rapid, convenient, and cost-effective manner utilizing conventional processing techniques and apparatus. Further, the methodology provided by the present invention enjoys diverse utility in the manufacture of numerous and various types of semiconductor devices and/or components requiring well-controlled threshold voltages.

DISCLOSURE OF THE INVENTION

An advantage of the present invention is an improved method for controlling the work function of metal-based gate electrode(s) of an MOS transistor and/or a CMOS device.

Another advantage of the present invention is an improved method for forming an in-laid metal gate electrode MOS transistor and/or CMOS device.

Yet another advantage of the present invention is an improved method for forming a Si-based, metal-gate MOS transistor and/or CMOS device.

Still another advantage of the present invention is improved in-laid metal gate electrode MOS transistors and CMOS devices.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of forming a semiconductor device, which method comprises the sequential steps of:

(a) providing a semiconductor substrate having a thin gate insulator layer formed on a surface thereof;

(b) forming a thin amorphous semiconductor layer on the thin gate insulator layer;

(c) introducing at least one dopant species of p-type or n-type conductivity into the thin amorphous semiconductor layer; and (d) forming a gate electrode on the n-type or p-type dopant-containing amorphous semiconductor layer.

According to embodiments of the present invention, step (b) comprises forming the thin amorphous semiconductor layer by means of a low pressure chemical vapor deposition (LPCVD), chemical vapor deposition (CVD), or physical vapor deposition (PVD) process which causes substantially no damage to the underlying thin gate insulator layer; and step (c) comprises controlling the amount of the n-type or p-type dopant species introduced into the thin amorphous semiconductor, thereby controlling the work function of the gate electrode formed in step (d), wherein step (c) comprises introducing the at least one n-type or p-type dopant species into the thin amorphous semiconductor layer by means of a sufficiently low energy doping process which substantially prevents damage to the underlying thin gate insulator layer and doping of a channel region in the semiconductor substrate beneath the thin gate insulator layer.

According to a particular embodiment of the present invention, step (c) comprises introducing the at least one dopant species into the thin amorphous semiconductor layer by means of a low energy plasma process utilizing a low sheath voltage of from about 50 to about 200 V.

According to further embodiments of the present invention, step (d) comprises forming the gate electrode from an electrically conductive material comprising at least one metal, metal alloy, metal composite, or metal compound.

According to yet further embodiments of the present invention, the method further comprises the step of:

(e) activating the at least one p-type or n-type dopant species in the amorphous semiconductor layer during subsequent thermal processing at an elevated temperature, further including reforming the amorphous semiconductor layer into a polycrystalline layer during the subsequent thermal processing at an elevated temperature.

According to still further embodiments of the present invention, step (a) comprises providing a semiconductor substrate having a plurality of spaced-apart pairs of source/drain regions formed in the surface thereof, a segment of the thin gate insulator layer being formed on the portion of the substrate surface between the source and drain regions of each source/drain pair; step (b) comprises forming the thin amorphous semiconductor layer on each of the segments of the thin gate insulator layer; step (c) comprises selectively introducing the at least one p-type dopant species into portions of the thin amorphous semiconductor layer overlying selected ones of the segments of the thin gate insulator layer and selectively introducing the at least one n-type dopant species into other portions of the thin amorphous semiconductor layer overlying the other segments of the thin gate insulator layer; and step (d) comprises forming a gate electrode in contact with the surface of each portion of the thin amorphous semiconductor layer overlying a segment of the thin gate insulator layer.

According to particular embodiments of the present invention, step (c) further comprises controlling the amount of p-type or n-type dopant species introduced into each portion of the thin amorphous semiconductor layer, thereby controlling the work function of each gate electrode formed in step (d).

According to further particular embodiments of the present invention, step (a) comprises providing a silicon (Si) semiconductor substrate having a thin gate insulator layer formed on a surface thereof; step (b) comprises forming an amorphous silicon (a-Si) layer on the thin gate insulator layer by means of a LPCVD, CVD, or PVD process which causes substantially no damage to the underlying thin gate insulator layer; and step (c) comprises introducing into the a-Si layer at least one p-type dopant species selected from boron (B)-containing ions and aluminum (Al)-containing ions or at least one n-type dopant species selected from phosphorus (P)-containing ions, arsenic (As)-containing ions, and antimony (Sb)-containing ions, by means of a plasma process which substantially prevents damage to the underlying thin gate insulator layer and doping of a channel region in the Si semiconductor substrate beneath the thin gate insulator layer; and step (d) comprises forming an electrically conductive gate electrode comprising at least one metal in contact with the n-type or p-type dopant containing thin amorphous Si layer.

According to another aspect of the present invention, a method of forming a Si-based semiconductor device comprising at least one MOS transistor including an in-laid gate electrode having a predetermined work function, comprises the steps of:

(a) providing a Si semiconductor substrate including at least a region of a first conductivity type and having a surface;

(b) forming in the region of first conductivity type a pair of spaced-apart source and drain regions of a second, opposite conductivity type, the pair of spaced-apart source and drain regions extending to the substrate surface and including a pair of opposed, facing edges with a space therebetween;

(c) forming a layer of an insulative material extending over the substrate surface;

(d) exposing a portion of the substrate surface including the pair of facing edges of the pair of spaced-apart source and drain regions and the space therebetween;

(e) forming a thin gate insulator layer on the exposed portion of the substrate surface;

(f) forming a thin a-Si layer on the thin gate insulator layer by means of a deposition process which causes substantially no damage to the thin gate insulator layer;

(g) introducing a predetermined amount of at least one dopant species of n-type or p-type conductivity into the thin a-Si layer by means of a sufficiently low energy process which causes substantially no damage to the thin gate insulator layer beneath the thin a-Si layer and substantially no doping of a channel region in the Si semiconductor substrate beneath the thin gate insulator layer;

(h) forming an electrically conductive gate electrode on the n-type or p-type dopant containing a-Si layer; and (i) activating the at least one n-type or p-type dopant species introduced into the a-Si layer and reforming the n-type or p-type dopant-containing a-Si layer into a polycrystalline Si layer; whereby the electrically conductive gate electrode has a predetermined work function.

According to embodiments of the invention, step (a) comprises providing a semiconductor substrate including at least one first type region of the first conductivity type and at least one second type region of a second, opposite conductivity type; step (b) comprises forming in each of the first type and the second type regions a pair of spaced-apart source and regions of an opposite conductivity type, each pair of source and drain regions extending to the surface and including a pair of opposed, facing edges with a space therebetween; step (d) comprises exposing portions of the substrate surface at each pair of spaced-apart source and drain regions, such that each exposed portion includes the pair of facing edges of the respective spaced-apart pair of source and drain regions and the said space therebetween; step (e) comprises forming a thin gate insulator layer segment on each exposed portion of the substrate surface; step (f) comprises forming a thin a-Si layer segment on each thin gate insulator layer segment; step (g) comprises selectively introducing the at least one p-type dopant species and the at least one n-type dopant species into respective thin a-Si layer segments formed in step (f) on each of the thin gate insulator layer segments formed in step (e); step (h) comprises forming an electrically conductive gate electrode on each dopant-containing thin a-Si layer segment formed in step (g); and step (i) comprises activating each of the at least one p-type and n-type dopant species introduced into each thin a-Si layer segment in step (g) and reforming each dopant-containing thin a-Si layer segment into a dopant-containing polycrystalline Si layer segment; whereby each electrically conductive gate electrode formed in step (h) has a different predetermined work function depending upon the conductivity type and amount of dopant introduced into the respective underlying thin a-Si layer segment in step (g).

According to a particular embodiment of the present invention, step (g) comprises selectively masking predetermined segments of the thin a-Si layer segments formed in step (f).

According to a first alternative embodiment of the present invention, step (b) comprises selectively forming a pair of spaced-apart metal silicide layers on respective spaced-apart portions of the substrate surface, introducing a dopant species of second, opposite conductivity type into the pair of spaced-apart metal silicide layers, and forming the pair of spaced-apart source and drain regions by out-diffusion of the dopant of second, opposite conductivity type from the pair of spaced-apart metal silicide layers into the substrate; and step (d) comprises forming an opening extending through the layer of insulative material to form the exposed portion of the substrate surface at the bottom of the opening.

According to a second alternative embodiment of the present invention, step (b) comprises forming a temporary gate electrode structure on a portion of the substrate surface and implanting dopant-containing ions of the second, opposite conductivity type into the substrate surface to form the pair of spaced-apart source and drain regions, the temporary gate electrode forming at least part of an implantation mask during the implanting; step (c) comprises forming a blanket layer of an insulative material extending over the temporary gate electrode structure and the substrate, followed by planarization processing of the blanket layer to remove at least the portion thereof overlying the temporary gate electrode structure; and step (d) comprises removing the temporary gate electrode structure to form the exposed substrate surface portion.

According to yet another aspect of the present invention, Si-based MOS transistors and/or CMOS devices formed according to the first and second alternative embodiments are provided.

Additional advantages and aspects of the present invention will become apparent to those skilled in the art from the following detailed description, wherein embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein:

FIGS. 6(A)–7(A) are schematic, simplified, cross-sectional views illustrating stages in the formation of an in-laid gate electrode MOS transistor according to an embodiment of the present invention, corresponding to the stages illustrated in FIGS. 6–7 of the first method; and FIGS. 15(A)–16(A) are schematic, simplified, cross-sectional views illustrating stages in the formation of an in-laid gate electrode MOS transistor according to another embodiment of the present invention, corresponding to the stages illustrated in FIGS. 15–16 of the second method.

DESCRIPTION OF THE INVENTION

The present invention is based upon the discovery that thin, doped Si layers for use as work function control/adjust layers intermediate an in-laid metal electrode and an underlying thin gate insulator layer of a MOS transistor and/or CMOS device, can be readily formed by a process which prevents, or at least substantially reduces, damage to the thin gate insulator layer and doping of the underlying channel region within the semiconductor substrate characteristic of the conventional dopant implantation-based methodology. A key feature of the present invention is the initial formation of a thin amorphous Si ("a-Si") layer over the thin gate insulator layer, rather than a polycrystalline Si layer as in conventional practice. The thin amorphous Si layer, in contrast with the conventional polycrystalline Si layer, facilitates doping by means of a low energy process, e.g., plasma doping at a low sheath voltage, and thus advantageously avoids, or at least minimizes, the damage to the thin gate insulator layer and doping of the channel region therebelow characteristic of conventional, ion implantation-based doping. According to the present invention, the relatively high resistance, doped a-Si layer is then converted to a layer of relatively low resistance, doped polycrystalline Si during subsequent thermal processing at an elevated temperature utilized for, e.g., metallization/contact formation, etc. according to conventional methodology. As a consequence of the inventive methodology, subjection of the thin gate insulator layer and its underlying channel region to high energy processing for dopant introduction, e.g., ion implantation processing, is avoided, and high quality in-laid metal gate MOS transistors and CMOS devices having well-controlled work functions, thus desired threshold voltages, $V_t$, can be reliably and conveniently fabricated in a cost-effective manner utilizing conventional manufacturing techniques and apparatus.

More specifically, the inventive methodology is applicable to all manner of processing sequences for the formation of in-laid metal gate MOS transistors and/or CMOS devices wherein, as part of the fabrication methodology, a surface of the thin gate insulator layer is exposed through an opening in an overlying dielectric layer. According to a first step of the inventive methodology, the exposed surface of the thin gate insulator layer is then subjected to an appropriate deposition process for forming thereon a thin layer of a-Si (e.g., from about 100 to about 500 Å thick) which deposition process incurs substantially no damage to the thin gate insulator layer and does not introduce the dopant species into the underlying channel region of the Si substrate, e.g., low pressure chemical vapor deposition (LPCVD) or chemical vapor deposition (CVD) of a silicon-containing gas such as silane ($SiH_4$) or disilane ($S_2H_6$), or physical vapor deposition at low particle energies.

According to a second step of the present invention, the thus-formed thin a-Si layer is then subjected to a doping process wherein the (at least one) dopant species of desired conductivity type has (have) sufficiently low energy so as to substantially prevent, or at least minimize, damage to the underlying thin gate insulator layer and doping of the channel region therebelow. By way of illustration, but not limitation, a suitable low energy doping process for use with, e.g., 100–500 Å thick a-Si layers such as contemplated for use herein, is DC, AC, or RF plasma doping performed at a low sheath voltage of from about 50 to about 200 V. Such plasmas are typically hydrogen-based and thus are generated from a suitable mixtures of hydrogen gas ($H_2$) and at least one gas of at least one dopant-containing species. The conductivity type of the dopant species of the dopant-containing gas(es) utilized in a particular process is determined by the conductivity type of the source and drain regions of the transistor(s). For example, suitable dopant-containing gases for use with NMOS transistors having n-doped source/drain regions include phosphine, $PH_3$, for supplying phosphorus (P) dopant atoms/ions; arsine, $AsH_3$, for supplying arsenic (As) dopant atoms/ions; and stibine, $SbH_3$, for supplying antimony (Sb) dopant atoms/ions. Suitable dopant-containing gases for use with PMOS transistors having p-doped source/drain regions include diborane, $B_2H_6$, for supplying boron (B) atoms/ions; and aluminum chloride, $AlCl_3$, for supplying aluminum (Al) atoms/ions.

According to the invention, the flow rate and concentration of dopant-containing gas(es) in the $H_2$-based plasma, plasma power, duration of exposure of the thin a-Si layer to the plasma doping treatment, etc., are selected for use in a given application according to, inter alia, the particular dopant-containing species and a-Si layer thickness, to provide a dopant concentration resulting in a desired work function value, typically on the order of about $10^{20}$ da/cm$^3$. When fabricating devices including both NMOS and PMOS transistors formed on or within a common semiconductor substrate, e.g., CMOS devices, separate plasma treatments for doping the thin gate insulator layer of the NMOS transistor(s) with an n-type dopant species and for doping the thin gate insulator layer of the PMOS transistor(s) with a p-type dopant are performed utilizing conventional selective masking techniques for each plasma treatment, e.g., photolithographic masking and etching techniques.

According to a third step of the present invention, the thus-formed doped, thin a-Si layer of relatively high resistivity is converted to a doped polycrystalline Si layer of relatively low resistivity by means of a subsequent thermal treatment at an elevated temperature. Dopant activation occurs simultaneously with the conversion of the a-Si to polycrstalline Si. Thus, an additional advantage afforded by the inventive methodology is the lack of a requirement for a separate thermal treatment step for dopant activation and polycrystallization of the doped a-Si layer. More specifically, satisfactory dopant activation and conversion of the doped a-Si layer to a layer of doped polycrystalline Si may be effected simultaneous with the subsequent formation of the metal gate layer (28 or 128) by means of a process performed at an elevated temperature, e.g., CVD of tungsten from tungsten hexafluoride ($WF_6$) at about 450° C.

Figure 6A:
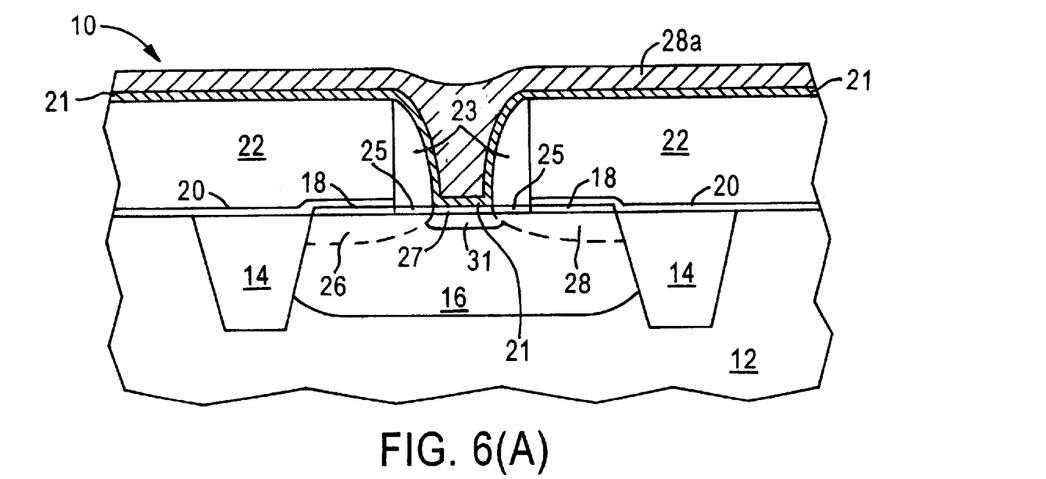
Figure 15A:
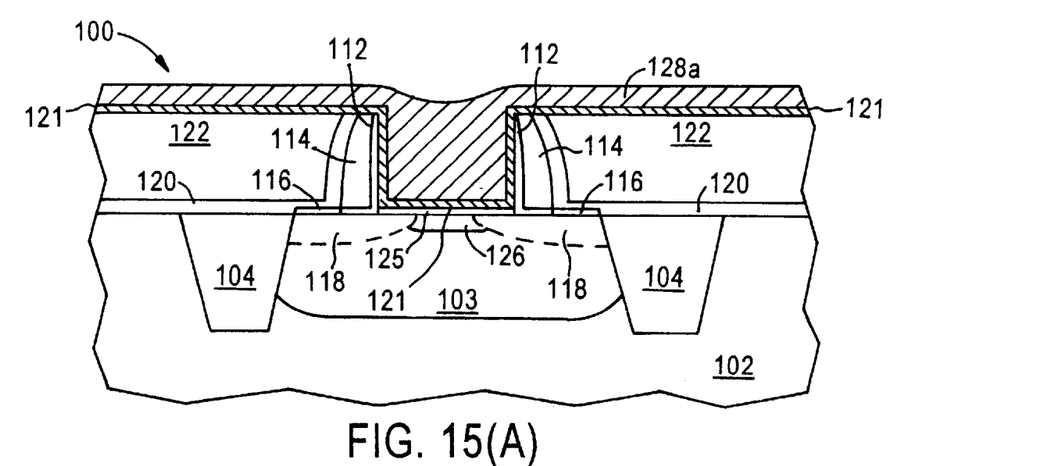

As indicated above, the inventive methodology is broadly applicable to various schemes for the manufacture of in-laid metal gate MOS transistors and/or CMOS devices, wherein, as part of the process flow, an opening is made in a dielectric layer to expose the surface of the thin gate insulator, which opening is subsequently filled with the metal(s) of the gate electrode. By way of illustration of the versatility of the present invention, reference is again made to FIGS. 1–7 and 8–16 as showing first and second alternative process sequences for manufacturing submicron-dimensioned MOS transistors and CMOS devices. According to the invention, the illustrated sequences of steps of each of the alternative process sequences are maintained as shown until the stages or intermediate structures shown in FIGS. 5 and 14, respectively, are obtained. Specifically, as shown in FIGS. 6(A) and 15(A), according to the invention, the first and second alternative sequences, respectively, are modified so as to include an additional step of forming, as by a LPCVD, CVD, or PVD process described above, a thin (i.e., 100–500 Å thick) a-Si layer (21 or 121) overlying the exposed surface of the thin gate insulator layer (25 or 125) formed at the bottom of the opening (24 or 124) after formation of the latter by etching of the overlying dielectric layer (22 or 122). As illustrated, the thin a-Si layer (21 or 121) is blanket-deposited over the thus-formed structure so as to extend along the interior wall of the opening (24 or 124) and over the upper surface of the dielectric layer (22 or 122). Doping of the thus-formed a-Si layer (21 or 121) to include an appropriate amount (typically ~$10^{20}$ da/cm$^3$) of at least one dopant species of desired conductivity type for providing a desired work function value is then effected by means of e.g., a low sheath voltage H$_2$/dopant-containing DC, AC, or RF-generated gas plasma, as described supra. A layer of a metal or metal-containing, electrically conductive material, e.g., comprising one or more of Mo, W, Ti, Al, WSi$_2$, NiSi, and TiN, preferably W obtained by CVD of WF$_6$ at about 450° C., is then deposited over the doped a-Si layer (21 or 121) to form a sufficiently thick blanket layer (28a or 128a) filling the opening (24 or 124) and extending over the upper surface of the doped a-Si layer (21 or 121) portions which extend over the upper surface of the dielectric layer (22 or 122). Activation of the dopant species contained in the a-Si layer (21 or 121) and conversion of the latter to a polycrystalline layer (21a or 121a) of substantially increased electrical conductivity occurs simultaneous with the formation of the blanket layer (28a or 128a) by CVD at elevated temperature.

Figure 7A:
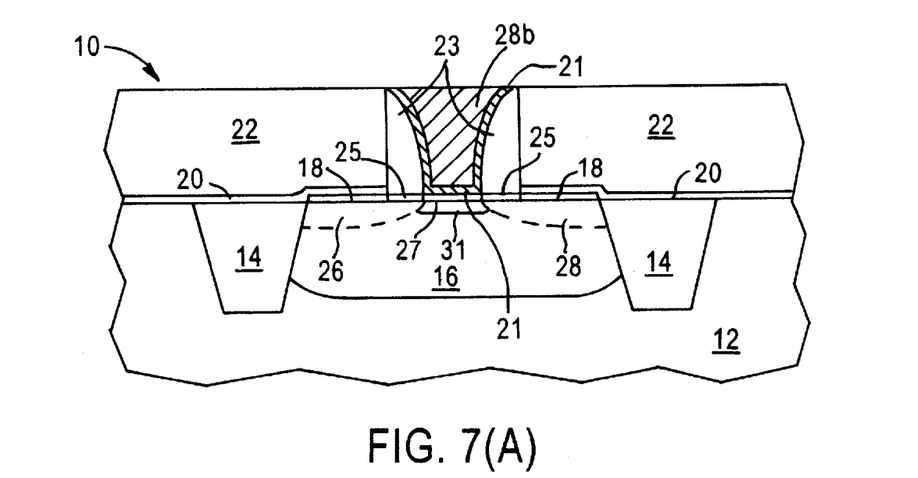
Figure 16:
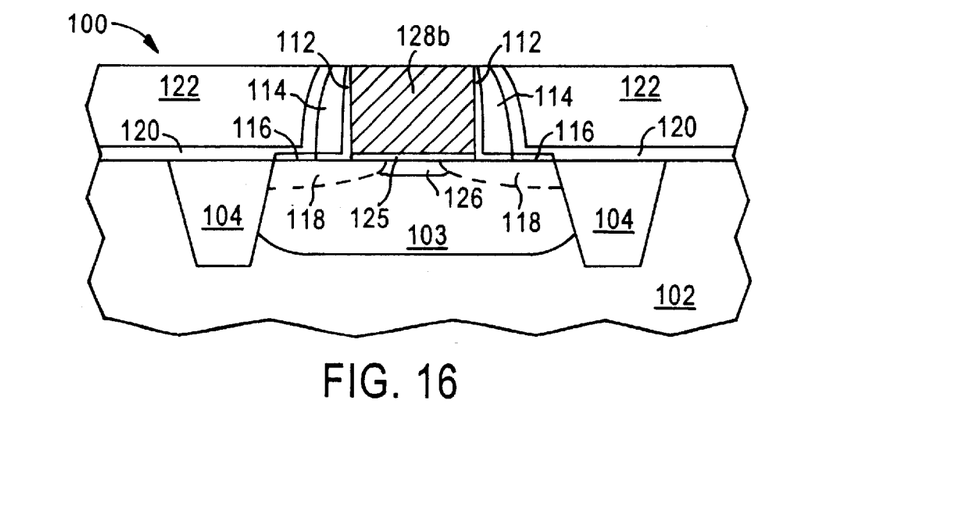
Figure 16A:
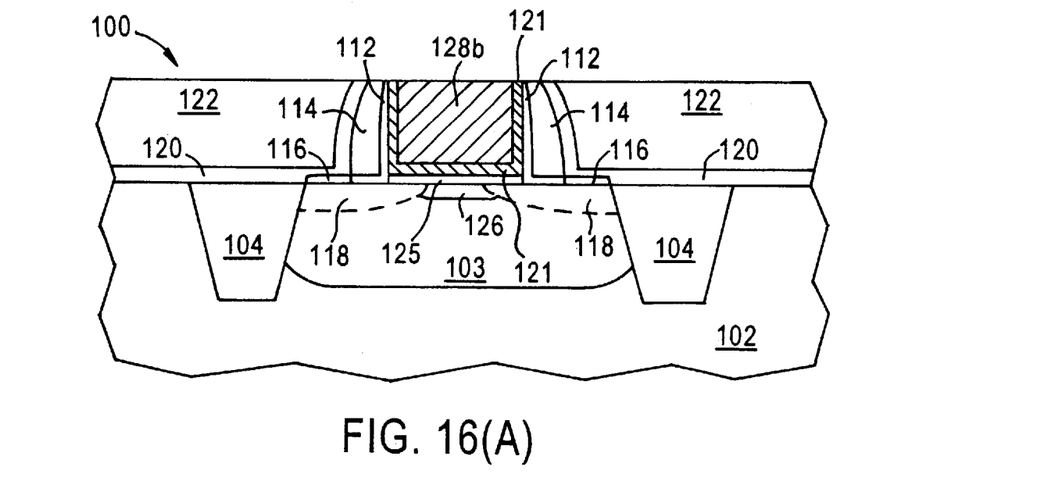

Referring now to FIGS. 7(A) and 16(A), the in-laid gate electrode formation process according to the invention is completed, as before, by performing a planarization step, typically CMP, for removing the portions of the blanket layers (28a, 128a) and underlying doped polycrystalline Si layers (21a, 121a) extending over the respective dielectric layer (22, 122) and for rendering the upper surfaces of the remaining electrically conductive plugs (28b, 128b) constituting the gate electrodes co-planar with the exposed upper surfaces of the respective dielectric layers (22, 122). As before, conventional photolithographic masking and etching techniques may then be utilized to form openings in the dielectric layers (22, 122) for forming electrical contacts to the source and drain regions.

As a consequence of the inventive methodology, thin, doped polycrystalline Si layers for work function control of in-laid metal gate electrodes of MOS transistors may be formed between the metal gate electrode and underlying thin gate insulator layer by a low energy process which advantageously avoids damage to the thin gate oxide layer and doping of the underlying channel region within the semiconductor substrate, thereby facilitating proper adjustment of the transistor threshold voltage, $V_t$. Thus, MOS transistors and MOS devices formed according to the invention are of higher quality than similar MOS transistors and CMOS devices formed according to conventional processing schemes and techniques, and exhibit superior electrical performance and reliability vis-à-vis such conventionally fabricated MOS transistors and CMOS devices.

The present invention thus enables reliable formation of defect-free, high quality MOS transistors and CMOS devices having appropriate threshold voltages $V_t$ for use in particular applications. In addition, the inventive methodology enjoys utility in the manufacture of various other semiconductor devices requiring metal gate electrodes along with work function control. Moreover, the invention can be practiced by use of conventional technologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes or modifications within the scope of the inventive concept as expressed herein.

What is claimed is:

1. A method of manufacturing a semiconductor device, comprising the sequential steps of:
    (a) providing a semiconductor substrate having a gate insulator layer formed on a surface thereof;
    (b) forming an amorphous semiconductor layer comformally directly on said gate insulator layer and within an opening in an overlying dielectric layer;
    (c) introducing at least one dopant species of p-type or n-type conductivity into said amorphous semiconductor layer by means of a sufficiently low energy process which substantially prevents damage to the underlying gate insulator layer and doping of a channel region in said semiconductor substrate beneath said gate insulator layer; and
    (d) forming a gate electrode on the n-type or p-type dopant-containing amorphous semiconductor layer.

2. The method as in claim 1, wherein:
    step (b) comprises forming said amorphous semiconductor layer by means of a low pressure chemical vapor deposition (LPCVD), chemical vapor deposition (CVD), or physical vapor deposition (PVD) process which causes substantially no damage to the underlying gate insulator layer.

3. The method as in claim 1, wherein:
    step (c) comprises controlling the amount of said n-type or p-type dopant species introduced into said amorphous semiconductor layer, thereby controlling the work function of said gate electrode formed in step (d).

4. The method as in claim 1, wherein:
    step (c) comprises introducing said at least one dopant species into said amorphous semiconductor layer by means of a low energy plasma process utilizing a low sheath voltage of from about 50 to about 200 V.

5. The method as in claim 1, wherein:
    step (d) comprises forming said gate electrode from an electrically conductive material comprising at least one metal, metal alloy, metal composite, or metal compound.

6. The method as in claim 1, further comprising the step of:
    (e) activating said at least one p-type or n-type dopant species in said amorphous semiconductor layer during subsequent thermal processing.

7. The method as in claim 6, wherein:
    step (e) further includes reforming said amorphous semiconductor layer into a polycrystalline layer during said subsequent thermal processing.

8. The method as in claim 1, wherein:
    step (a) comprises providing a semiconductor substrate having a plurality of spaced-apart pairs of source/drain regions formed in said surface thereof, a segment of said gate insulator layer being formed on the portion of said substrate surface between the source and drain regions of each source/drain pair;

step (b) comprises forming said amorphous semiconductor layer on each of said segments of said gate insulator layer;

step (c) comprises selectively introducing said at least one p-type dopant species into portions of said amorphous semiconductor layer overlying selected ones of said segments of said gate insulator layer and selectively introducing said at least one n-type dopant species into other portions of said amorphous semiconductor layer overlying the other segments of said gate insulator layer; and step (d) comprises forming a gate electrode in contact with the surface of each said portion of said amorphous semiconductor layer overlying a segment of said gate insulator layer.

9. The method as in claim 8, wherein:

step (c) further comprises controlling the amount of p-type or n-type dopant species introduced into each said portion of said amorphous semiconductor layer, thereby controlling the work function of each gate electrode formed in step (d).

10. The method as in claim 1, wherein:

step (a) comprises providing a silicon (Si) semiconductor substrate having a gate insulator layer formed on a surface thereof.

11. The method as in claim 10, wherein:

step (b) comprises forming an amorphous silicon (a-Si) layer on said gate insulator layer by means of a LPCVD, CVD, or PVD process which causes substantially no damage to the underlying gate insulator layer.

12. The method as in claim 11, wherein:

step (c) comprises introducing into said a-Si layer at least one p-type dopant species selected from boron (B)-containing ions and aluminum (Al)-containing ions or at least one n-type dopant species selected from phosphorus (P)-containing ions, arsenic (As)-containing ions, and antimony (Sb)-containing ions, by means of a plasma process which substantially prevents damage to the underlying gate insulator layer and doping of a channel region in said Si semiconductor substrate beneath said gate insulator layer; and step (d) comprises forming an electrically conductive gate electrode comprising at least one metal in contact with the n-type or p-type dopant-containing amorphous Si layer.

13. A method of forming a Si-based semiconductor device comprising at least one MOS transistor including an in-laid gate electrode having a work function, comprising the steps of:

(a) providing a Si semiconductor substrate including at least a region of a first conductivity type and having a surface;

(b) forming in said region of first conductivity type a pair of spaced-apart source and drain regions of a second, opposite conductivity type, said pair of spaced-apart source and drain regions extending to said surface and including a pair of opposed, facing edges with a space therebetween;

(c) forming a layer of an insulative material extending over said substrate surface;

(d) exposing a portion of said substrate surface including said pair of facing edges of said pair of spaced-apart source and drain regions and said space therebetween;

(e) forming a gate insulator layer on said exposed portion of said substrate surface;

(f) forming an a-Si layer conformally directly on said gate insulator layer and said insulative material by means of a deposition process which causes substantially no damage to said gate insulator layer;

(g) introducing at least one dopant species of n-type or p-type conductivity into said a-Si layer by means of a sufficiently low energy process which causes substantially no damage to said gate insulator layer beneath said a-Si layer and substantially no doping of a channel region in said Si semiconductor substrate beneath said gate insulator layer;

(h) forming an electrically conductive gate electrode on the n-type or p-type dopant-containing a-Si layer; and (i) activating said at least one n-type or p-type dopant species introduced into said a-Si layer and reforming said n-type or p-type dopant-containing a-Si layer into a polycrystalline Si layer;

whereby said electrically conductive gate electrode has a work function.

14. The method as in claim 13, wherein:

step (a) comprises providing a semiconductor substrate including at least one first type region of said first conductivity type and at least one second type region of a second, opposite conductivity type;

step (b) comprises forming in each of said first type and said second type regions a pair of spaced-apart source and drain regions of an opposite conductivity type, each pair of source and drain regions extending to said surface and including a pair of opposed, facing edges with a space therebetween;

step (d) comprises exposing portions of said substrate surface at each pair of spaced-apart source and drain regions, such that each exposed portion includes the said pair of facing edges of the respective spaced-apart pair of source and drain regions and the said space therebetween;

step (e) comprises forming a gate insulator layer segment on each said exposed portion of said substrate surface;

step (f) comprises forming an a-Si layer segment on each said gate insulator layer segment;

step (g) comprises selectively introducing said at least one p-type dopant species and said at least one n-type dopant species into respective a-Si layer segments formed in step (f) on each of said gate insulator layer segments formed in step (e);

step (h) comprises forming an electrically conductive gate electrode on each dopant-containing a-Si layer segment formed in step (g); and step (i) comprises activating each of said at least one p-type and n-type dopant species introduced into each a-Si layer segment in step (g) and reforming each said dopant-containing a-Si layer segment into a dopant-containing polycrystalline Si layer segment;

whereby each electrically conductive gate electrode formed in step (h) has a different work function depending upon the conductivity type and amount of dopant introduced into the respective underlying a-Si layer segment in step (g).

15. The method as in claim 14, wherein:

step (g) comprises selectively masking segments of said a-Si layer segments formed in step (f).

16. The method as in claim 13, wherein:

step (b) comprises selectively forming a pair of spaced-apart metal silicide layers on respective spaced-apart portions of said substrate surface, introducing a dopant species of second, opposite conductivity type into said pair of spaced-apart metal silicide layers, and forming said pair of spaced-apart source and drain regions by out-diffusion of said dopant of second, opposite conductivity type from said pair of spaced-apart metal silicide layers into said substrate; and step (d) comprises forming an opening extending through said layer of insulative material to form said exposed portion of said substrate surface at the bottom of said opening.

17. The method as in claim 13, wherein:

step (b) comprises forming a temporary gate electrode structure on a portion of said substrate surface, and implanting dopant-containing ions of said second, opposite conductivity type into said substrate surface to form said pair of spaced-apart source and drain regions, said temporary gate electrode forming at least part of an implantation mask during said implanting;

step (c) comprises forming a blanket layer of an insulative material extending over said temporary gate electrode structure and said substrate, followed by planarization processing of said blanket layer to remove at least the portion thereof overlying said temporary gate electrode structure; and step (d) comprises removing said temporary gate electrode structure to form said exposed substrate surface portion.

* * * * *